(12) United States Patent
Jaeger et al.

(10) Patent No.: US 11,139,415 B2
(45) Date of Patent: Oct. 5, 2021

(54) METHOD FOR PRODUCING AN OPTOELECTRONIC DEVICE AND OPTOELECTRONIC DEVICE

(71) Applicant: OSRAM OLED GmbH, Regensburg (DE)

(72) Inventors: Harald Jaeger, Regensburg (DE); Daniel Leisen, Regensburg (DE); Jens Eberhard, Regensburg (DE); Ivar Tangring, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/631,847

(22) PCT Filed: Jul. 11, 2018

(86) PCT No.: PCT/EP2018/068828
§ 371 (c)(1),
(2) Date: Jan. 17, 2020

(87) PCT Pub. No.: WO2019/016047
PCT Pub. Date: Jan. 24, 2019

(65) Prior Publication Data
US 2020/0161495 A1 May 21, 2020

(30) Foreign Application Priority Data
Jul. 17, 2017 (DE) ..................... 10 2017 116 050.7

(51) Int. Cl.
*H01L 33/00* (2010.01)
*H01L 25/075* (2006.01)
*H01L 33/48* (2010.01)

(52) U.S. Cl.
CPC .......... *H01L 33/005* (2013.01); *H01L 25/075* (2013.01); *H01L 33/48* (2013.01); *H01L 2933/0033* (2013.01)

(58) Field of Classification Search
CPC ................. H01L 33/005; H01L 25/075; H01L 2933/0033; H01L 33/48–648;
(Continued)

(56) References Cited

U.S. PATENT DOCUMENTS 9,543,486 B1   1/2017  Lin et al.
2011/0068358 A1* 3/2011 Kuo .......... H01L 33/58
                                              257/98
(Continued)

FOREIGN PATENT DOCUMENTS

DE  102009031008 A1  12/2010
DE  102015102699 A1   8/2016
WO     2017062116 A1   4/2017

OTHER PUBLICATIONS

International Search Report issued for corresponding international PCT-Application No. PCT/EP2018/068828 dated Oct. 22, 2018, 16 pages (for informational purpose only).
(Continued)

*Primary Examiner* — Jonathan Han
(74) *Attorney, Agent, or Firm* — Viering, Jentschura & Partner mbB

(57) ABSTRACT

An optoelectronic component may be produced by providing a temporary carrier, applying a functional film to the temporary carrier, arranging optoelectronic elements within openings of the functional film in such a way that the mounting sides are facing towards the temporary carrier. The optoelectronic elements are thicker than the functional film such that the elements protrude beyond the functional film in a direction away from the temporary carrier. The method may further include applying a potting compound laterally
(Continued)

around the elements and covering the function film and curing the potting compound to form a potting. The method may further include cutting between the openings to create individual optoelectronic components.

20 Claims, 6 Drawing Sheets

(58) Field of Classification Search
CPC ....... H01L 2933/005; H01L 2933/0066–0091; H01L 2933/0091; H01L 33/60; H01L 33/56; H01L 33/50; H01L 33/54; H01L 2933/0058
See application file for complete search history.

(56) References Cited

U.S. PATENT DOCUMENTS

| | | | |
|---|---|---|---|
| 2012/0012867 A1* | 1/2012 | Shen | H01L 33/50 257/89 |
| 2012/0139003 A1* | 6/2012 | Zitzlsperger | H01L 33/486 257/99 |
| 2017/0005245 A1* | 1/2017 | Hsu | H01L 33/62 |
| 2017/0092825 A1 | 3/2017 | Bando | |
| 2018/0006203 A1* | 1/2018 | Liu | H01L 33/60 |
| 2018/0248091 A1* | 8/2018 | Herrmann | H01L 33/54 |

OTHER PUBLICATIONS

German Search Report issued for corresponding DE application No. 10 2017 116 050.7, dated May 4, 2018, 7 pages (for informational purpose only).

* cited by examiner

METHOD FOR PRODUCING AN OPTOELECTRONIC DEVICE AND OPTOELECTRONIC DEVICE

CROSS-REFERENCE TO RELATED APPLICATIONS

The present application is a national stage entry according to 35 U.S.C. § 371 of PCT application No.: PCT/EP2018/068828 filed on Jul. 11, 2018; which claims priority to German Patent Application Serial No.: 10 2017 116 050.7, which was filed on Jul. 17, 2017; which is incorporated herein by reference in its entirety and for all purposes.

TECHNICAL FIELD

A method for producing an optoelectronic device is specified. Furthermore, an optoelectronic device is specified.

BACKGROUND

One object to be achieved consists in specifying a method for producing an optoelectronic device in which the individual intermediate products and also the end product are stable and thus easily handleable. A further object to be achieved consists in specifying an optoelectronic device which has a high stiffness.

SUMMARY

In accordance with at least one embodiment, the method for producing an optoelectronic device includes a step A), in which a temporary carrier is provided. The temporary carrier is for example a film, in particular a pliable or flexible film. For example, the temporary carrier is a metal carrier, such as a steel carrier, or a glass carrier or a carrier composed of FR4. For example an adhesive layer, for example a double-sided adhesive film, is secured on a top side of the temporary carrier.

In accordance with at least one embodiment, the method includes a step B), in which a functional film is applied on the temporary carrier. The functional film is applied in particular to the top side of the carrier. By way of example, the functional film is secured on the temporary carrier by means of the adhesive layer.

In accordance with at least one embodiment, the functional film has a plurality of openings or perforations or cutouts. The functional film includes for example a top side and an underside running substantially parallel thereto. The top side and the underside form main sides of the functional film. The openings extend for example completely from the top side as far as the underside, such that the functional film has holes. After the functional film has been applied to the temporary carrier, the temporary carrier or the adhesive layer is initially exposed in the region of the openings.

Each opening of the functional film is completely surrounded by the material of the functional film in a lateral direction, parallel to the main direction of extent of the functional film. In a plan view of the top side of the functional film, for example, each opening is completely surrounded by a continuous sheet composed of the material of the functional film.

The functional film is pliable or flexible, for example. In particular, the functional film having the openings is a separately handlable component part which, even without being secured on the temporary carrier, is mechanically stable, crack-resistant and self-supporting. The functional film is provided with the openings already before being applied to the temporary carrier.

The functional film has for example a thickness, measured from the top side to the underside of at least 5 µm or at least 10 µm or at least 20 µm or at least 50 µm. Alternatively or additionally, the thickness of the functional film is for example at most 100 µm or at most 80 µm or at most 50 µm or at most 20 µm.

In accordance with at least one embodiment, the method includes a step C), which involves arranging optoelectronic components with a respective mounting side within the openings.

In accordance with at least one embodiment, in step C) the mounting sides of the components in each case face the carrier.

The mounting side of the component is, in particular, a side of the component via which no or no significant portion of the electromagnetic radiation is emitted during operation as intended. By way of example, the mounting side is a contact side having electrical contact elements for electrically contacting the optoelectronic component. A top side of the component opposite the mounting side forms for example a radiation exit surface, via which for example at least 30% or at least 50% or at least 80% of the electromagnetic radiation generated is coupled out from the component during operation as intended.

The optoelectronic components are for example semiconductor chips which emit electromagnetic radiation, for example in the UV range or in the blue or green or red or infrared spectral range, during operation as intended. The semiconductor material of the semiconductor chips is based on AlInGaN, for example. The semiconductor chips can be for example thin-film chips, in which the growth substrate is removed, or flip-chips, in which the growth substrate, for example sapphire, is still present.

Here and hereinafter a semiconductor chip is understood to mean a separately handlable and electrically contactable element. A semiconductor chip arises in particular from the singulation of a semiconductor layer sequence grown on a growth substrate. A semiconductor chip includes exactly one originally continuous region of the semiconductor layer sequence grown. In particular, an optoelectronic semiconductor chip includes an, for example exactly one, active layer. The lateral extent of the semiconductor chip, measured parallel to the main direction of extent of the active layer, is for example at most 1% or at most 5% greater than the lateral extent of the active layer.

The optoelectronic components can also be semiconductor chips having in each case an already applied converter layer.

However, the optoelectronic components can also include in each case exactly one semiconductor chip as defined above with or without a converter layer, and a housing, for example a reflective housing, surrounding the semiconductor chip laterally, that is to say parallel to the main direction of extent of the active layer of the semiconductor chip. For example, the housing is a $TiO_2$ potting. However, the housing can also be metallic. The housing can be formed such that it surrounds the semiconductor chip exclusively laterally, such that main sides of the semiconductor chip are not covered by the housing. For example, the components are so-called CSP (Chip Scale Package) components, which are specified in even greater detail further below.

Furthermore, the housing can also form a carrier for the semiconductor chip. The housing then surrounds the semiconductor chip not just laterally, rather the semiconductor chip bears by one of its main sides on a mounting surface of the housing. The housing thus has a cavity, in which the semiconductor chip is arranged. For example, the housing includes a leadframe, on which the semiconductor chip bears and via which the semiconductor chip is contacted.

The components are adhesively bonded onto the temporary carrier for example within the openings, for example by means of the adhesive layer present on the temporary carrier.

After the components have been positioned within the openings, for example one component is assigned to each opening one-to-one. That is to say that exactly one component is positioned in each opening. In a plan view, each component is then completely surrounded by a continuous sheet composed of the material of the functional film.

The lateral extents of the openings are in each case greater than the lateral extents of the components, such that the components fit completely into the openings.

In accordance with at least one embodiment, the optoelectronic components are thicker than the functional film, such that after step C) the components project beyond the functional film in a direction away from the temporary carrier. The thickness of the components is defined in particular as the respective distance between the top side and the mounting side of the components. After the components have been positioned in the openings, the top sides of the components in each case project beyond the functional film in a direction away from the temporary carrier. The top sides and mounting sides of the components can then run for example substantially parallel to the main direction of extent of the functional film and/or of the temporary carrier.

By way of example, the thickness of the functional film is at most 50% or at most 30% or at most 10% or at most 5% of the thickness of the components. For example, the components project beyond the functional film by at least 50 µm or by at least 80 µm or by at least 120 µm or by at least 150 µm.

In accordance with at least one embodiment, the method includes a step D), in which a potting compound is applied in such a way that the potting compound forms around the components in a lateral direction and covers the functional film in the region laterally next to the components or laterally next to the openings. In this case, the potting compound is in direct contact with the components. In particular, the potting compound is thus applied in the region between the components or between the openings. However, the potting compound can also be applied to the components, in particular to the radiation exit surface.

The potting compound can be applied or molded on for example by means of injection molding or a pressing method.

The potting compound can be a radiation-transmissive potting compound. It can be transparent, for example pellucid, or translucent, for example milky cloudy, for the radiation emitted by the optoelectronic components. The potting compound can furthermore include converter particles for converting the electromagnetic radiation emitted by the components. A radiation-transmissive potting compound is applied not only next to the components, but also on top of the components.

However, the potting compound can also be a reflective potting compound, for example having a reflectance of at least 80% or at least 90% for the radiation emitted by the components. A reflective potting compound is applied only in the region laterally next to the components, such that it does not cover, or at most partly covers, the top sides of the components.

In particular, however, the potting compound can also be applied in a multilayered fashion, for example in a two-layered fashion, such that the potting compound, after being applied, includes two or more layers lying one above another. For example, initially one reflective potting compound is applied which forms around the components only laterally. This forms a first layer of the potting compound. This first layer terminates flush for example with the top sides of the components. The thickness of the first layer is then for example between 120% and 80%, inclusive, of the thickness of the components. However, the layer composed of the reflective potting compound can also be chosen to be thinner, for example having a thickness that is at most 50% or at most 20% of the thickness of the components.

Afterward, for example, a radiation-transmissive potting compound is then applied to the top sides of the components and to the reflective potting compound in the region laterally next to the components. This radiation-transmissive potting compound then forms a second layer of the potting compound.

The potting compound or the different layers of the potting compound are applied to the components for example in liquid or viscous form, in particular in a shapeable state of matter.

By way of example, the potting compound is applied to the semiconductor chips in a positively locking manner, such that the potting compound conformally copies the shape of the components. The potting compound, in particular the radiation-transmissive potting compound, can be applied directly to the top sides of the components. Alternatively, further layers or materials can be applied to the components beforehand. Moreover, the potting compound can be applied to the functional film directly and/or in a positively locking manner in the region laterally next to the components.

By way of example, after step D) the potting compound, in particular a radiation-transmissive potting compound, covers a plurality of optoelectronic components and is embodied in this case in a continuous fashion, in particular in a simply connected fashion.

In accordance with at least one embodiment, the method includes a step E), in which the potting compound is cured to form a potting. After curing, the potting is self-supporting, for example. In particular, the potting is chosen such that it remains mechanically self-supporting and cured over the entire temperature range provided for the operation of the finished device, for example between −50° C. and +150° C. inclusive. The potting can be two-layered, including a reflective layer and a radiation-transmissive layer.

After curing, a thickness of the potting in the region of the functional film and/or in the region of the component is for example at least 50 µm or at least 100 µm or at least 150 µm. The thickness here is measured in particular perpendicular to the main direction of extent of the functional film. In particular, the potting projects beyond the components in a direction away from the temporary carrier also in the region between the components.

In accordance with at least one embodiment, the functional film is chosen such that it forms a reinforcement, also called armor, for the cured potting. In other words, the functional film forms a mechanical reinforcement for the potting. The functional film has in particular a higher compressive and/or tensile strength than the potting. The functional film thus stabilizes the potting.

In accordance with at least one embodiment, the method includes a step F), which involves severing the functional film in the region between the openings, thus giving rise to individual optoelectronic devices. The optoelectronic devices each include an optoelectronic component surrounded laterally both by the potting and by a functional layer composed of a part of the functional film.

Thus, devices that each include exactly one optoelectronic component, one potting and also one part of the functional film are formed as a result of the singulating. Said part of the functional film, here and hereinafter also referred to as functional layer, remains within the devices, that is to say is not detached later. The functional layer forms a reinforcement or armor for the potting of each device and stabilizes the potting. In a non-limiting embodiment, each device thus produced includes a functional layer forming, in a plan view of the top side of the component, a continuous sheet completely surrounding the component.

The devices produced are for example so-called chip scale package devices, the lateral extent of which or the volume of which is substantially determined by the lateral extent or the volume of the associated semiconductor chip. By way of example, for each device the semiconductor chip occupies at least 50% or at least 70% or at least 80% of the total volume of the device. Alternatively or additionally, at least 50% or at least 70% or at least 80% of an underside of each device is formed by the mounting side of the semiconductor chip.

In at least one embodiment, the method for producing an optoelectronic device includes a step A), in which a temporary carrier is provided. In a step B), a functional film is applied on the temporary carrier, wherein the functional film has a plurality of openings. A step C) involves arranging optoelectronic components with a respective mounting side within the openings in such a way that the mounting sides face the temporary carrier. In this case, the optoelectronic components are thicker than the functional film, such that the components project beyond the functional film in a direction away from the temporary carrier. In a step D), a potting compound is applied in such a way that the potting compound forms around the components laterally and covers the functional film in the region laterally next to the components. In a step E), the potting compound is cured to form a potting, wherein the functional film is chosen such that it forms a reinforcement for the potting. A step F) involves severing the functional film in the region between the openings, thus giving rise to individual optoelectronic devices, each having an optoelectronic component surrounded laterally both by the potting and by a functional layer composed of a part of the functional film.

The present disclosure is based on the insight, in particular, that in the case of very compact devices, in particular so-called chip scale package devices, a mechanically stable housing is not constructed around the components. Rather, only the potting serves as a housing around the component, but said potting is often formed from a soft or crack-prone material, such as silicone, and therefore has only a low mechanical stability. This makes the processability and the handling of such devices difficult. Particularly during the handling of the devices, it then often happens that the potting tears off or breaks.

In the case of the various embodiments described herein, in order to solve this problem, use is made of a functional film, inter alia, which forms a reinforcement or armor for the potting both during the production method and on the finished device and, as a result, increases the stiffness both of the intermediate products produced during the method and of the finished devices.

In accordance with at least one embodiment, steps A) to F) are carried out in the specified order and successively.

In accordance with at least one embodiment, the functional film is formed from a material having a higher modulus of elasticity than the modulus of elasticity of the cured potting. By way of example, the modulus of elasticity of the functional film is at least double or at least 5 times or at least 10 times or at least 50 times or at least 100 times greater than the modulus of elasticity of the cured potting. In particular, this relation holds true for all temperatures that may occur during operation of the device as intended, that is to say for example for the entire temperature range of between −50° C. and +140° C. inclusive or between 0° C. and 50° C. inclusive. Furthermore, the relation holds true in particular for expansion or compression in a lateral direction, parallel to the main direction of extent of the functional film.

The increased modulus of elasticity of the functional film in comparison with the potting increases the stability and stiffness both of the intermediate products of the method and of the finished device.

In accordance with at least one embodiment, the functional film consists of or includes one or more of the following materials: glass, glass fiber, carbon, carbon fiber, ceramic, mineral solid, mineral porous or mineral fibrous materials, plastics, metal, metal film. In particular, the functional film includes or consists of a mixture of fibrous or porous materials mentioned above with an epoxy or a silicone.

In accordance with at least one embodiment, the functional film is a porous or fibrous film. That is to say that the functional film has initially, in particular before step D), air-filled cavities or interspaces. For example, at least 10% by volume or at least 30% by volume of the functional film is formed by cavities or interspaces.

The potting compound or some other potting compound or a converter layer can be applied directly to the functional film and fill the cavities or interspaces in the pores or between the fibers, such that after the applied material has been cured, the functional film extends at least partly within the potting or within some other applied potting or within the converter layer. This can further increase the stiffness and stability of the intermediate products and end products.

In accordance with at least one embodiment, the material for the functional film is chosen such that the functional film has a greater thermal conductivity than the cured potting. By way of example, the thermal conductivity of the functional film for the entire temperature range specified above is at least double the magnitude or at least 5 times the magnitude or at least 10 times the magnitude or at least 50 times the magnitude or at least 100 times the magnitude of the thermal conductivity of the potting. By way of example, the thermal conductivity of the functional film in said temperature range is at least 0.7 W/(m·K) or at least 1 W/(m·K) or at least 5 W/(m·K) or at least 10 W/(m·K).

For the purpose of increasing the thermal conductivity, the functional film can include one or more fillers, such as AlN, $Al_2O_3$, $SiO_2$ or Al.

If a material having poor thermal conductivity, such as silicone, is used for the potting, such a functional film can contribute to improved heat dissipation during the operation of the devices.

In accordance with at least one embodiment, the functional film is chosen such that it has a reflective effect for electromagnetic radiation emitted by the optoelectronic components during operation as intended. For example, the reflectivity of the functional film for said radiation is at least 50% or at least 70% or at least 90%, specified in each case for the wavelength at which the emitted radiation has its intensity maximum.

Radiation losses often occur particularly in the region of the mounting side, that is to say in the lower region of the components. Besides increasing the stiffness of the devices, it is therefore advantageous if the functional film is embodied in a reflective fashion in order to direct the radiation in the direction of the top side of the component or of the device.

In accordance with at least one embodiment, the optoelectronic components are surface-mountable components having in each case, at the mounting side, the electrical contact elements necessary for contacting the component. In particular, the components are embodied as so-called flip-chips or thin-film chips. All contact elements necessary for contacting the component are situated on a single contact side, the mounting side in the present case. The components can thus be electrically connected only by means of a soldering connection in the region of the mounting side. Electrical contact wires are then not necessary. The contact elements are embodied in a metallic fashion.

In accordance with at least one embodiment, the potting compound is shaped following step D) such that each component is encapsulated in a lens composed of the potting. In this case, the potting is embodied in a radiation-transmissive fashion or includes a radiation-transmissive layer. The lens is configured in particular for the collimation of the electromagnetic radiation emitted by the component during operation as intended. In particular, one lens is assigned to each component one-to-one.

In accordance with at least one embodiment, the lenses each have a greater lateral extent than the associated optoelectronic components. By way of example, the lateral extent of each lens composed of the potting is at least 5% or at least 10% or at least 20% greater than the lateral extent of the component. Alternatively or additionally, the lateral extent of each lens is at most 50% or at most 40% or at most 30% greater than the lateral extent of the associated component. The lateral extent of the lens is determined for example by the lateral extent of the region of the potting which has a curved outer surface serving for collimation.

In accordance with at least one embodiment, the potting compound or at least one layer of the potting compound is based on a silicone or consists of a silicone. Alternatively, the potting compound or at least one layer of the potting compound can also be based on an epoxy or consist of an epoxy. In a non-limiting embodiment, all layers of the potting or of the potting compound, in particular both the reflective layer and the radiation-transmissive layer, are based on silicone or epoxy.

In accordance with at least one embodiment, the functional film has sloping sidewalls in the region of the openings, such that the openings become narrower or taper in the direction of the temporary carrier. To put it another way, the sidewalls of the functional film that laterally delimit the openings do not run perpendicularly to the main direction of extent of the functional film, but rather at an acute angle with respect to the underside of the functional film of, for example, between 30° and 70° inclusive.

In accordance with at least one embodiment, the functional film has a functional coating. Alternatively, the functional film can also have a surface roughening. By way of example, the functional film can be provided with the functional coating or with the surface roughening on the top side and/or on the underside and/or in the region of the sidewalls.

In accordance with at least one embodiment, the functional coating or the surface roughening is chosen such that it supports the flow of a liquid material applied directly to the functional film. In particular, the distribution along the functional film is supported. The liquid material can be the potting compound or a converter material applied in liquid form.

The functional coating can be for example at most 2 μm or at most 1 μm or at most 500 nm thick. The functional coating is already part of the functional film before the components are positioned in the openings of the functional film. The functional coating is a Teflon coating, for example.

In accordance with at least one embodiment, two adjacent openings, in particular each two adjacent openings, of the functional film are connected by a gap in the functional film, wherein the gap ensures a uniform distribution of the potting compound. The gap extends for example from the top side as far as the underside of the functional film, that is to say completely through the functional film. By way of example, the gap has a width of at most 100 μm or at most 50 μm or at most 20 μm or at most 10 μm.

The gap in the functional film connects two adjacent openings and can make it possible for example for the liquid potting compound to flow away or overflow from one opening to the other opening.

In accordance with at least one embodiment, after step C) and before step D) a reflector layer is introduced in the region of the openings. The reflector layer is configured in particular to reflect the electromagnetic radiation generated by the components during operation as intended. By way of example, the reflector layer is a mixture of titanium oxide, such as $TiO_2$, with silicone or epoxy. The reflector layer is for example initially liquid or viscous and is then cured.

In accordance with at least one embodiment, the reflector layer is chosen to be so thin that the functional film projects beyond the reflector layer in a direction away from the temporary carrier. In a non-limiting embodiment, the reflector layer is arranged only in the region of the openings and does not cover the functional film in the region laterally next to the openings. By way of example, the reflector layer is at most half as thick or at most ⅓ or at most ⅕ or at most 1/10 as thick as the functional film.

In accordance with at least one embodiment, the contact elements at the mounting side of the components are chosen to have a thickness such that after the process of arranging the components in step C), a cavity arises between the temporary carrier and the components in the region laterally next to the contact elements. By way of example, for this purpose, the contact elements of the components are chosen to be at least 30 μm or at least 50 μm or at least 100 μm thick. When the reflector layer or a reflective potting compound is introduced, these cavities can be filled. For this purpose, the reflector layer or the reflective potting compound is embodied in an electrically insulating fashion.

Such a reflective potting compound or a reflector layer can further advantageously affect the emission characteristic of the resulting device. In particular, such a reflective potting compound or reflector layer provides for deflection or reflection of the electromagnetic radiation emerging via the mounting side or the electromagnetic radiation emerging in the region of the mounting side in the direction of the top side of the components.

In accordance with at least one embodiment, after step C), such as after applying the reflector layer or the reflective potting compound and before applying the radiation-transmissive potting compound, the components are coated with a converter layer for radiation conversion. The converter layer is configured to convert the electromagnetic radiation emitted by the components during operation as intended partly or completely, for example into red or yellow or green or white light. The converter layer includes inorganic or organic converter particles, for example. By way of example, the converter layer is at least 20 μm or at least 30 μm or at least 50 μm thick. Alternatively or additionally, the converter layer is at most 250 μm or at most 200 μm or at most 150 μm or at most 100 μm thick. In a non-limiting embodiment, the converter layer has a constant thickness within the scope of production tolerance. The converter layer can be sprayed on or laminated on or potted, for example. The converter layer can include silicone with converter particles embedded therein. The converter layer can be applied directly to the component and directly to the functional film.

In accordance with at least one embodiment, the temporary carrier has an adhesive layer at a top side. The adhesive layer consists of silicone or includes silicone, for example. During the process of applying the components with the mounting side foremost on the temporary carrier, the contact elements at the mounting side are immersed for example partly or completely in the adhesive layer. With the aid of the adhesive layer, both the components and the functional film can be temporarily secured to the temporary carrier.

In accordance with at least one embodiment, the temporary carrier is detached after step E), for example before or after step F), and the mounting side of the components is partly or completely exposed. By way of example, after the temporary carrier has been detached, the contact elements of the mounting side are exposed, such that they can be electrically contacted from the mounting side. The functional film can also be exposed in this step.

The use of the functional film is advantageous in this case, too, since it prevents a direct contact between the adhesive layer and the potting. In particular, the functional film is arranged between the potting and the adhesive layer and separates these from one another. This has an advantageous effect when detaching the temporary carrier since the risk of damage to the potting is reduced as a result. Since a tacky material, such as silicone, for example, is often used for pottings, a direct contact between the potting and the adhesive layer would result in a connection able to be released with significantly greater difficulty.

Furthermore, an optoelectronic device is specified. The optoelectronic device can be produced in particular by the method described here. That is to say that all features disclosed in connection with the method are also disclosed for the optoelectronic device, and vice versa.

In accordance with at least one embodiment, the optoelectronic device includes an optoelectronic component. The optoelectronic component includes a top side, a mounting side opposite the top side, and a side surface connecting the top side and the mounting side. The mounting side and the top side run for example substantially parallel to one another whereas the side surface runs for example substantially perpendicularly to the top side.

In accordance with at least one embodiment, the optoelectronic device includes a functional layer having a main direction of extent and having an opening.

In accordance with at least one embodiment, the device includes a potting, for example a radiation-transmissive or reflective potting or a multilayered potting, including a reflective layer and a radiation-transmissive layer.

In accordance with at least one embodiment, the optoelectronic component is arranged in the opening of the functional layer in such a way that the functional layer laterally surrounds the component at the level or in the region of the mounting side and the main direction of extent of the functional layer runs parallel to the mounting side. To put it another way, in a side view, looking at the side surface of the component, the functional layer covers the component in the region of the mounting side. In a non-limiting embodiment, the component is surrounded all around by a continuous sheet composed of the functional layer.

"Laterally" denotes a direction parallel to the main direction of extent of the functional layer or parallel to the mounting side of the component.

The main direction of extent of the functional layer runs substantially parallel to the mounting side. The thickness or the vertical extent of the functional layer then runs for example parallel to the side surface of the component. In particular, the functional layer has a larger area as seen in a plan view of the mounting side than as seen in a plan view of the side surface of the component.

In accordance with at least one embodiment, the functional layer is thinner than the component, such that the top side of the component projects beyond the functional layer. The component thus projects beyond the functional layer in a direction parallel to the side surface of the component. To put it another way, the component projects from the opening of the functional layer.

In accordance with at least one embodiment, the potting forms around the optoelectronic component in a lateral direction, such that at least one part of the side surface of the component is covered by the potting. By way of example, the potting is molded onto the side surface of the component in a positively locking manner.

The component can be spaced apart from the functional layer in a lateral direction, such as completely all around, by a gap. The potting can be arranged in the region of the gap.

In accordance with at least one embodiment, the potting covers the functional layer in the region laterally next to the opening. That is to say that the potting is arranged on a top side of the functional layer opposite the mounting side. In a non-limiting embodiment, the potting covers the entire top side of the functional layer. The lateral extent of the potting is for example at least 5% or at least 10% or at least 20% or at least 50% greater than the lateral extent of the component.

The potting is embodied in a continuous fashion or in a simply connected fashion. The potting is embodied in an integral fashion, for example. However, the potting can also be embodied in a multilayered fashion.

The potting and the functional layer form a housing body around the component. The thickness of the housing body laterally next to the component is for example between 150% and 50% inclusive, such as between 120% and 80% inclusive, of the thickness of the component. In this case, the potting forms the majority, for example at least 50% or at least 70%, of the volume of the housing body.

In accordance with at least one embodiment, the functional layer forms a reinforcement for the potting. That is to say that the functional layer stabilizes and reinforces the potting. In particular, the functional layer has a higher compressive and/or tensile strength than the potting. By way of example, the functional layer supports the potting over a large area. In a plan view of an underside of the device or the mounting side of the component, for example, at least 50% or at least 70% or at least 80% of the potting arranged laterally next to the component is covered by the functional layer.

Such a device can be self-supporting. The potting is supported by the semiconductor chip for example in the region of the component. In the region laterally next to the component, the potting is supported in particular by the functional layer. Apart from the component, the potting and the functional layer, the device in the unmounted state has no further self-supporting carrier, in particular no further self-supporting carriers, on the mounting side of the device. In a non-limiting embodiment, the device also does not include an additional housing laterally surrounding the potting.

In accordance with at least one embodiment, a side surface of the device is formed partly by the potting and partly by the functional layer. The side surface of the device is for example an outer surface of the device running transversely with respect to the mounting side of the component. The side surface delimits the device for example in a lateral direction.

The side surface can have traces of a physical or chemical material removal on account of the singulation process. By way of example, at least 60% or at least 80% of the side surface of the device is formed by the potting. At least 1% or at least 5% or at least 10% of the side surface of the device can be formed by the functional layer.

In accordance with at least one embodiment, the potting is based on silicone or consists of silicone. For example, at least 80% by volume or at least 90% by volume or at least 95% by volume of the potting is composed of silicone.

In accordance with at least one embodiment, the functional layer has a greater stiffness than the potting. In particular the bending stiffness or bending strength of the functional layer in the case of a bending moment running parallel to the main direction of extent of the functional layer or parallel to the mounting side of the component is greater, for example at least 2 times or at least 5 times or at least 10 times or at least 50 times or at least 100 times greater, than the bending strength or bending stiffness of the potting. That is to say that the functional layer counteracts a flexure of the device along the lateral direction of the device. During transport or mounting of the device, an underside of the device running parallel to the mounting side is curved to a lesser extent or is not curved at all. This can be achieved for example by the functional layer being formed from one of the materials mentioned above for the functional film.

In accordance with at least one embodiment, the potting forms a lens, into which the component is embedded.

In accordance with at least one embodiment, the lens has a greater lateral extent than the optoelectronic component.

In accordance with at least one embodiment, the optoelectronic device is embodied as a surface-mountable device. In particular, for this purpose the device has an underside having contact elements configured for electrically contacting the device. The underside of the device runs for example parallel to the mounting side of the component and forms a main side of the device.

In accordance with at least one embodiment, the component has contact elements at its mounting side, said contact elements being exposed as contact elements of the device at the underside of the device in the unmounted state of the device. In other words, the contact elements of the component simultaneously form the contact elements of the device. In particular, no further carrier is arranged between the contact elements of the component and the underside of the device. The contact elements of the component and/or of the device are embodied in particular in a metallic fashion.

In accordance with at least one embodiment, at the mounting side of the component a reflector layer is arranged between the contact elements. The reflector layer can be for example a layer composed of the reflective potting material described above. By way of example, the reflector layer covers the entire mounting side of the component apart from the contact elements.

In accordance with at least one embodiment, the reflector layer projects beyond the component in a lateral direction and reaches at least as far as the functional layer. As seen in a plan view of the top side of the component, the component is surrounded for example by a continuous sheet composed of the reflector layer. The reflector layer can be in direct contact with the functional layer, for example with the sidewalls of the functional layer.

In accordance with at least one embodiment, a converter layer for radiation conversion is arranged between the top side of the component and the potting. The converter layer has for example a thickness of between 20 µm and 200 µm inclusive.

In accordance with at least one embodiment, the converter layer partly or completely covers the side surface of the component. The converter layer can be in direct contact with the top side and/or the side surface of the component. In particular, the converter layer copies the shape of the top side and of at least one part of the side surface of the component in a positively locking manner.

In accordance with at least one embodiment, the converter layer is arranged between the potting and the functional layer in the region laterally next to the component. That is to say that the functional layer, the converter layer and the potting are stacked one above another in this order. The converter layer spaces apart the potting from the functional layer, for example. For example, the converter layer reaches as far as the side surface of the device.

A method described here for producing an optoelectronic device and also an optoelectronic device described here are explained in greater detail below on the basis of exemplary embodiments with reference to drawings. In this case, identical reference signs indicate identical elements in the individual figures. In this case, however, relations to scale are not illustrated; rather, individual elements may be illustrated with an exaggerated size in order to afford a better understanding.

BRIEF DESCRIPTION OF THE DRAWINGS

In the embodiments and figures, components which are the same or of the same type, or which have the same effect, are respectively provided with the same references. The elements represented and their size ratios with respect to one another are not to be regarded as to scale. Rather, individual elements, in particular layer thicknesses, may be represented exaggeratedly large for better understanding.

DETAILED DESCRIPTION

Figure 1A:
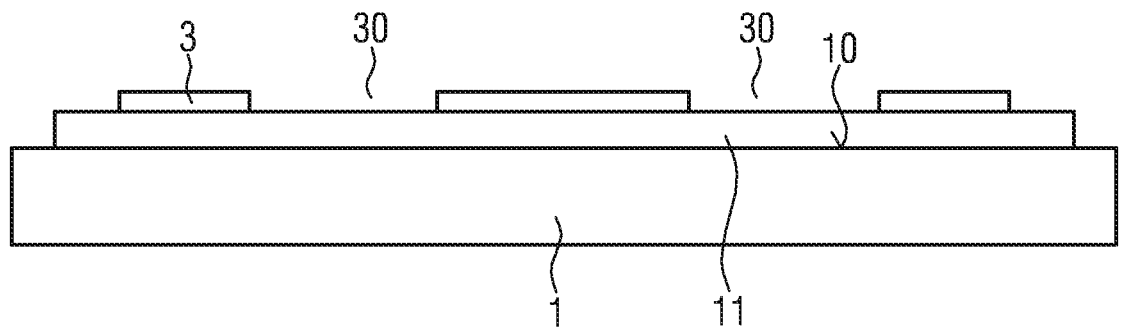
FIGS. 1A to 3 and 6A to 7 show various positions in exemplary embodiments of the method for producing an optoelectronic device.

FIG. 1A shows a first position in one exemplary embodiment of the method for producing an optoelectronic device. In this position, a temporary carrier 1, for example a glass or metal carrier, is provided. An adhesive layer 11, for example composed of a silicone-containing adhesive, is applied on the top side 10 of the temporary carrier 1.

A functional film 3 is applied on the top side 10 of the carrier 1. The functional film 3 is a glass fiber or carbon fiber film, for example. The functional film 3 has a plurality of openings 30 which extend from a top side of the functional film 3 as far as an underside of the functional film 3 and completely penetrate through the functional film 3.

The functional film 3 is secured to the temporary carrier 1 for example with the aid of the adhesive layer 11. The adhesive layer 11 is exposed in the region of the openings 30.

Figure 1B:
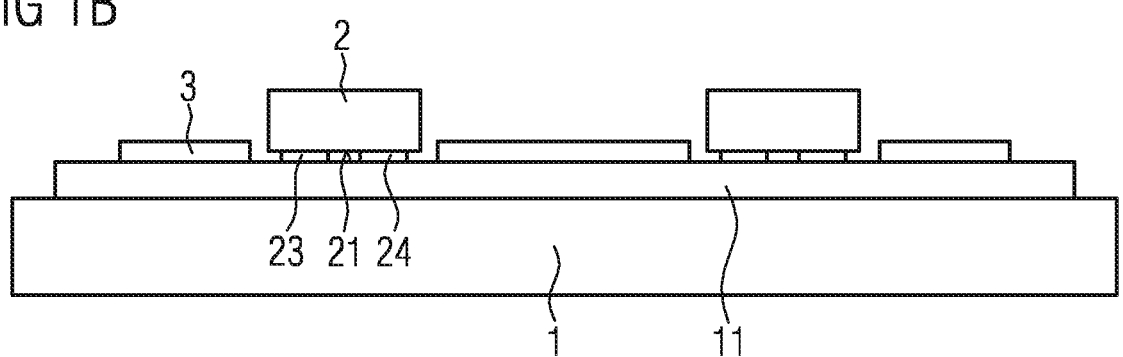

FIG. 1B shows a second position in the method, in which a plurality of optoelectronic components 2 in the form of semiconductor chips 2 are positioned on the temporary carrier 1 in the region of the openings 30. In this case, exactly one semiconductor chip 2 is arranged in each opening 30 of the functional film 3. The semiconductor chips 2 are secured to the temporary carrier 1 for example with the aid of the adhesive layer 11. Furthermore, the openings 30 are fashioned such that the semiconductor chips 2 completely fit into the openings 30.

The optoelectronic semiconductor chips 2 in FIG. 1B are so-called surface-mountable semiconductor chips or flip-chips. These chips have a mounting side 21, at which all contact elements 23, 24 necessary for electrically contacting the semiconductor chip 2 are arranged. During operation of the semiconductor chips 2, the latter emit for example UV light or visible light via a top side facing away from the mounting side 21.

The optoelectronic semiconductor chips 2 are thicker than the functional film 3, such that the semiconductor chips 2 project out beyond the openings 30 of the functional film 3.

Figure 1C:
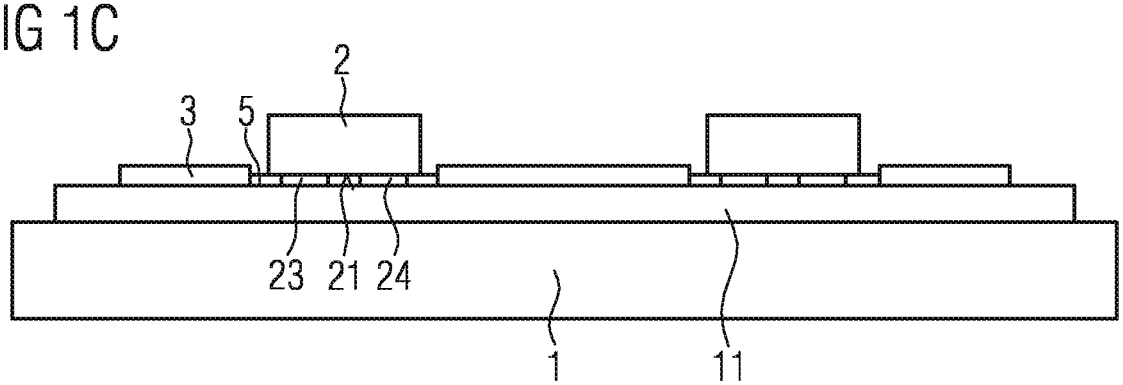

FIG. 1C shows a third position in the method, in which a reflector layer 5 is arranged in the region of the openings 30. The reflector layer 5 is for example a silicone layer with embedded $TiO_2$ particles. The reflector layer 5 is introduced for example in a liquid state and then cured to form the reflector layer 5. In this case, the thickness of the reflector layer 5 is chosen such that the functional film 3 projects beyond the reflector layer 5 in a direction away from the temporary carrier 1.

Furthermore, FIG. 1C reveals that the reflector layer 5 is also formed between the contact elements 23, 24. In particular, the cavities between the mounting side 21 and the adhesive layer 11 are filled with the reflector layer 5. This is achieved for example by the contact elements 23, 24 being chosen to be particularly thick, for example with a thickness of at least 30 µm and at most 100 µm. In particular, the contact elements 23, 24 are thicker than the adhesive layer 11. When the semiconductor chips 2 with the mounting side 21 foremost are immersed in the adhesive layer 11, cavities then form between the mounting side 21 and the adhesive layer 11, into which the reflector layer 5 can flow.

Figure 1D:
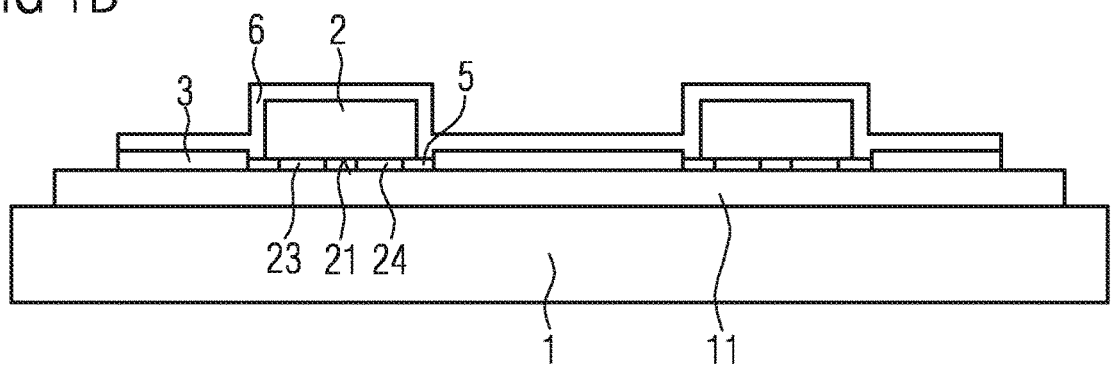

FIG. 1D illustrates a fourth position of the method. A converter layer 6 is applied to the functional film 3 and the semiconductor chips 2 over the whole area. In this case, the converter layer 6 covers a plurality of semiconductor chips 2 and the functional film 3 therebetween. In this case, the converter layer 6 is embodied in a continuous fashion or in a simply connected fashion. The thickness of the converter layer 6 is for example between 20 µm and 200 µm inclusive. The converter layer 6 can be based on silicone.

Figure 1E:
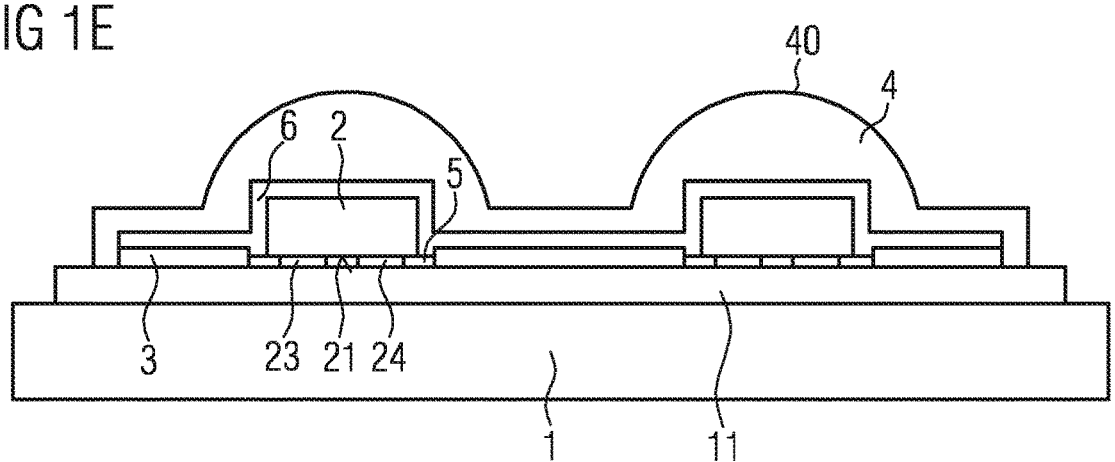

FIG. 1E illustrates a fifth position in the method, in which a radiation-transmissive potting compound 4 is applied to the semiconductor chips 2. The radiation-transmissive potting compound 4 is clear silicone, for example. The radiation-transmissive potting compound 4 covers both the semiconductor chips 2 and the functional film 3 in the region laterally next to the semiconductor chips 2. The radiation-transmissive potting compound 4 is applied in a liquid or viscous state, for example.

Furthermore, FIG. 1E reveals that the radiation-transmissive potting compound 4 is shaped to form individual lenses 40, wherein one lens 40 is assigned to each semiconductor chip 2 one-to-one. The semiconductor chips 2 are embedded in the assigned lenses 40. During operation as intended, the lenses 40 collimate the radiation emitted by semiconductor chips 2 via the top side thereof.

After the lens 40 has been shaped, the radiation-transmissive potting compound 4 is cured for example to form a radiation-transmissive potting 4.

Figure 1F:
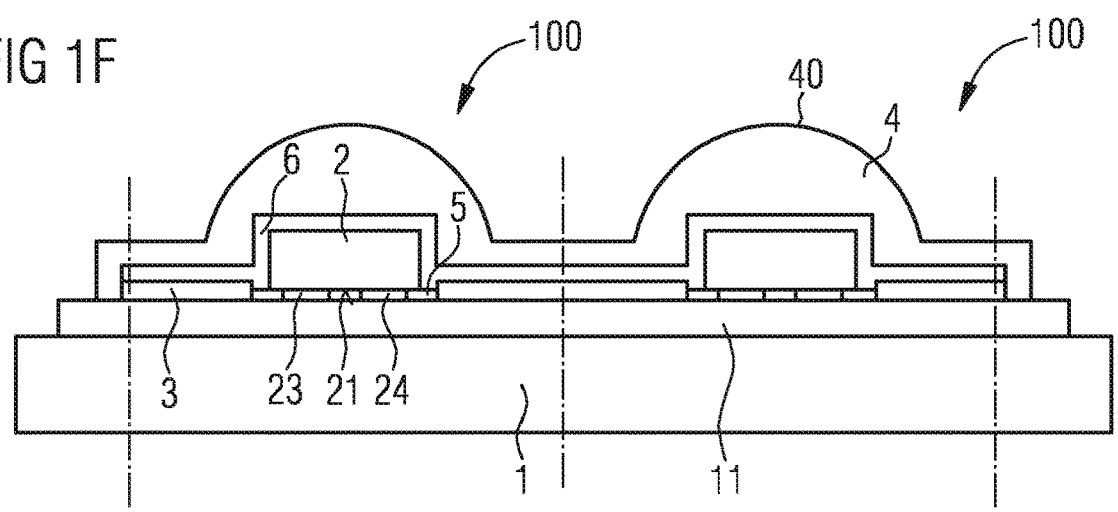

FIG. 1F shows a sixth position of the method, which involves severing the temporary carrier 1, the functional film 3, the converter layer 6 and the radiation-transmissive potting 4 in the region between adjacent semiconductor chips 2. Afterward, the temporary carrier 1 with the adhesive layer 11 can be detached (not illustrated), thus giving rise to individual optoelectronic devices 100.

Figure 2:
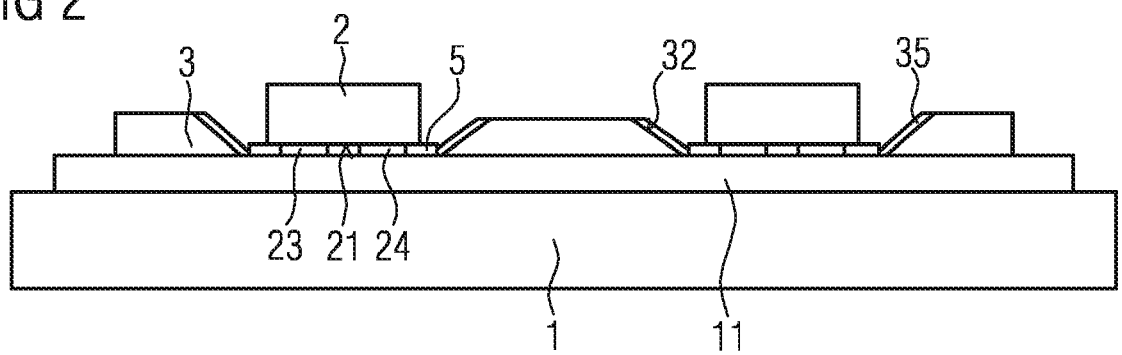

FIG. 2 shows a position in a further exemplary embodiment of the method. The position is similar to the position in FIG. 1C. Unlike in FIG. 1C, here the functional film 3 has sloping or oblique sidewalls 32, such that the openings 30 narrow from the top side of the functional film 3 toward the underside of the functional film 3. The sidewalls 32 are furthermore provided with a functional coating 35. The functional coating 35 is Teflon, for example. Said functional coating 35 increases for example the flowability for a radiation-transmissive potting compound 4, which ensures a better distribution of this potting compound within the openings 30.

Figure 3:
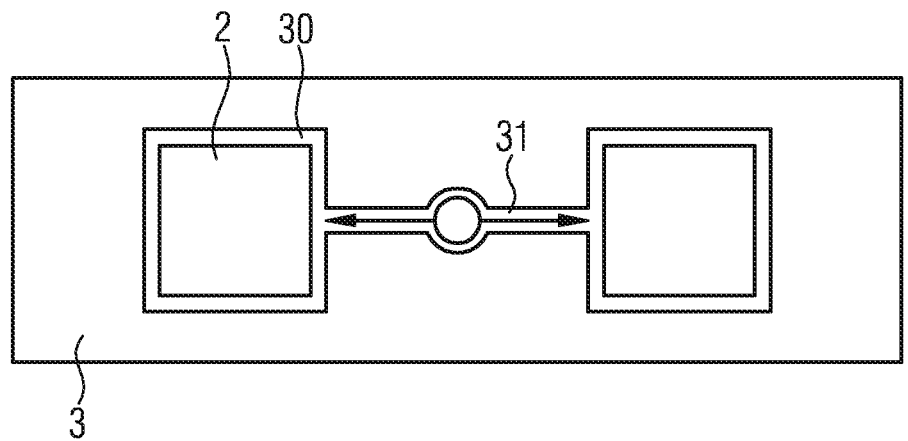

FIG. 3 shows a position of the method in a plan view of the top sides or radiation sides of the semiconductor chips 2. By way of example, FIG. 3 shows the same position as FIG. 1B, except in plan view instead of cross-sectional view. It is evident that two adjacent openings 30 in the functional film 3 are connected to one another by a gap 31 in the functional film 3. Like the openings 30, the gap 31 completely penetrates through the functional film 3. The gap 31 enables a uniform distribution of the radiation-transmissive potting compound 4 when the potting compound is applied.

Figure 4:
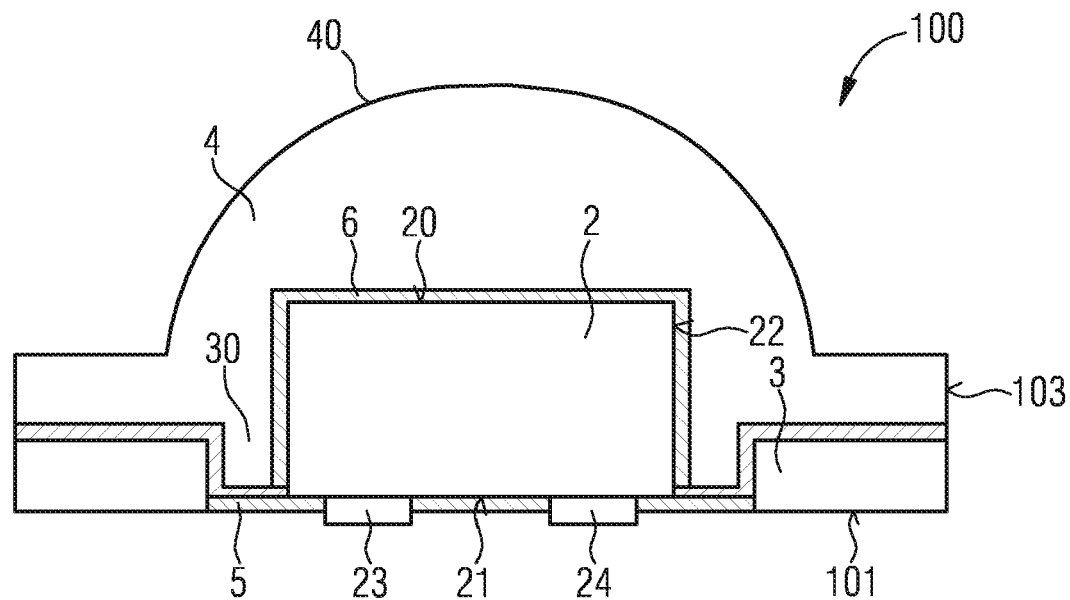
FIGS. 4 and 5 show embodiments of the optoelectronic device in cross-sectional view.

FIG. 4 shows one exemplary embodiment of an optoelectronic device 100 in cross-sectional view. The device 100 is produced for example by the method in accordance with FIGS. 1A to 1F. The device 100 includes a functional layer 3, for example composed of glass fiber or carbon fiber. The functional layer 3 has a main direction of extent and an opening 30 extending completely through the functional layer 3. Within the openings 30, an optoelectronic component 2 in the form of a semiconductor chip 2 having a mounting side 21 and a top side 20 opposite the mounting side 21 is arranged such that the mounting side 21 runs substantially parallel to the main direction of extent of the functional film 3.

The semiconductor chip 2 includes two contact elements 23, 24 at the mounting side 21. The contact elements 23, 24 are exposed at an underside 101 of the device 100 in the region of the openings 30. Thus, as long as the device 100 is not mounted, the contact elements 23, 24 are freely accessible at the underside 101 of the device 100.

The functional film 3 is also exposed at the underside 101 of the device 100. A reflector layer 5, for example including $TiO_2$, is arranged between the contact elements 23, 24 of the semiconductor chip 2.

The top side 20 of the semiconductor chip 2 projects beyond the functional layer 3 in a direction away from the underside 101. The top side 20 of the semiconductor chip 2 is for example a radiation exit surface of the semiconductor chip 2, via which at least 50% of the radiation generated is coupled out during operation as intended.

The top side 20 and the mounting side 21 are connected to one another via a side surface 22 of the semiconductor chip 2.

A converter layer 6, for example composed of an inorganic converter material, is applied to the semiconductor chip 2, in particular to the top side 20 and the side surface 22. During operation as intended, the converter layer 6 serves for converting the radiation emitted by the semiconductor chip 2 into radiation in a different wavelength range.

Besides the semiconductor chip 2, the converter layer 6 also covers the functional layer 3 in the region laterally next to the semiconductor chip 2 and respectively in the region outside the opening 30. In this case, the converter layer 6 is embodied for example in a simply connected fashion.

A radiation-transmissive potting 4, for example composed of clear silicone, is applied to the semiconductor chip 2. The radiation-transmissive potting 4 shapes a lens 40 around the semiconductor chip 2. The semiconductor chip 2 is embedded in the lens 40. To put it another way, the semiconductor chip 2 is surrounded by the lens-shaped, radiation-transmissive potting 4 in a positively locking manner. Furthermore, the radiation-transmissive potting 4 also covers the functional layer 3 in the region laterally next to the semiconductor chip 2 and respectively laterally next to the opening 30. An exposed side surface 103 of the device 100, said side surface running transversely with respect to the underside 101, is formed partly by the radiation-transmissive potting 4 and partly by the functional layer 3.

In the case of the device 100 in FIG. 4, the functional layer 3 serves as a reinforcement or armor for the radiation-transmissive potting 4. In particular, the functional layer 3 has a higher bending stiffness or bending strength than the radiation-transmissive potting 4, with the result that during mounting or during transport the device 100 does not become curved or becomes only slightly curved along the lateral extent, parallel to the underside 101 of the device 100.

Figure 5:
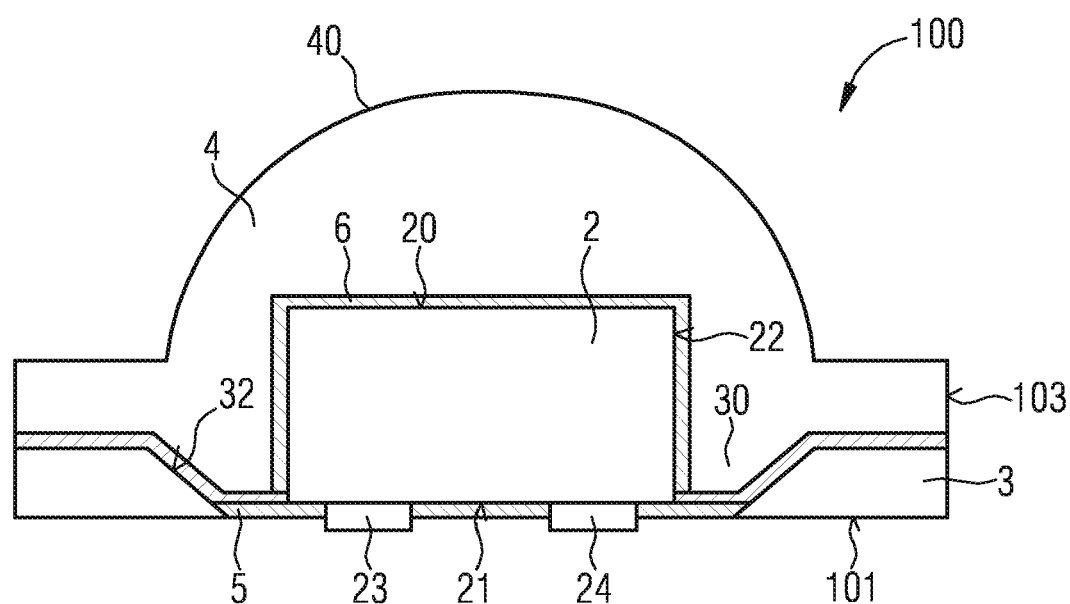

FIG. 5 shows a further exemplary embodiment of an optoelectronic device 100. In contrast to the device 100 in FIG. 4, here the functional layer 3 has obliquely sloping sidewalls 32 in the region of the openings 30, such that the opening 30 widens in a direction away from the underside 101 of the device 100.

The devices 100 in FIGS. 4 and 5 are for example so-called chip scale package devices, the volume or lateral extent of which is substantially determined by the volume and the lateral extent of the semiconductor chip 2.

Figure 6A:
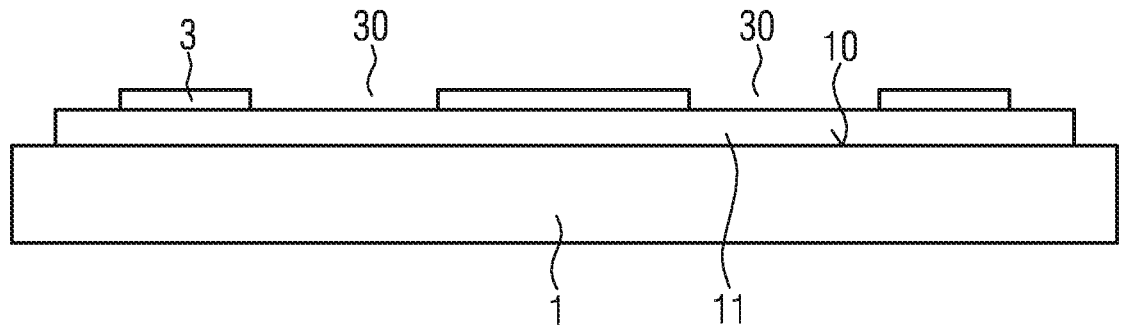
Figure 6B:
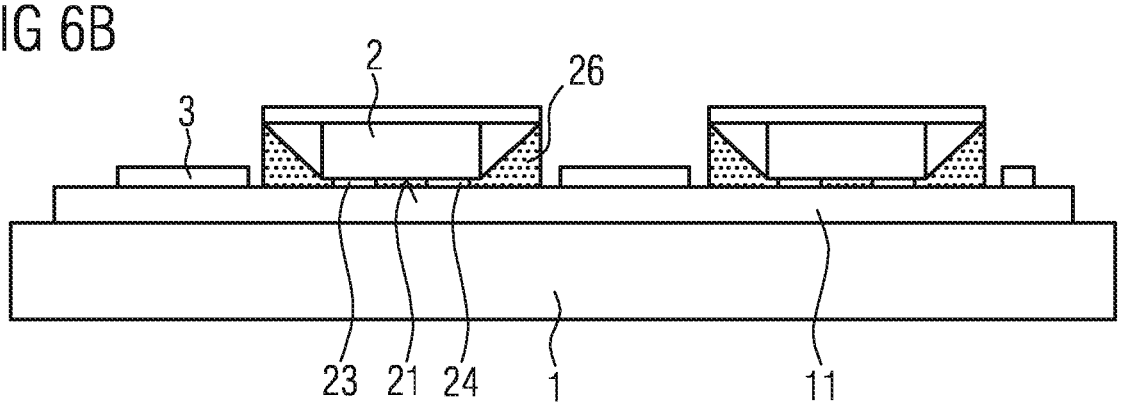

FIGS. 6A to 6B show various positions in a further exemplary embodiment for producing an optoelectronic device.

The position shown in FIG. 6A substantially corresponds to the position shown in FIG. 1A.

In FIG. 6B, as in FIG. 1B, optoelectronic components 2 are introduced into the openings 30 of the functional film 3. The components 2 are just formed differently in FIG. 6B. Whereas in FIG. 1B the components 2 were formed only by a respective semiconductor chip 2, the components 2 in FIG. 6B include both an optoelectronic semiconductor chip and a reflective housing 26 laterally surrounding the semiconductor chip. The components 2 are CSP components, for example. The semiconductor chips can be flip-chips or thin-film semiconductor chips. The housing 26 includes or consists of metal or a reflective potting, for example. Moreover, the components 2 already each include a converter element on radiation exit surfaces of the semiconductor chips.

Figure 6C:
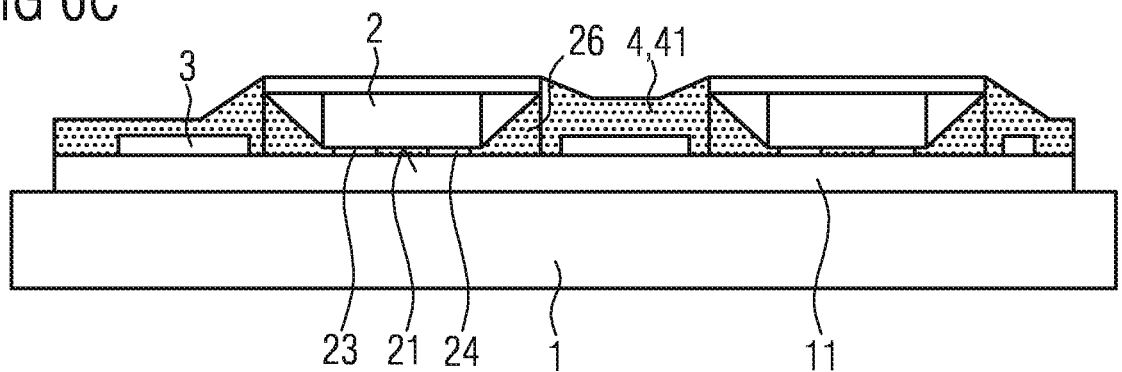

FIG. 6C shows a position of the method in which a potting compound 4, 41 is applied exclusively in the region laterally next to the components 2. The potting compound 4, 41 forms around the components 2 in a lateral direction. The potting compound 4, 41 is a reflective potting compound.

Figure 6D:
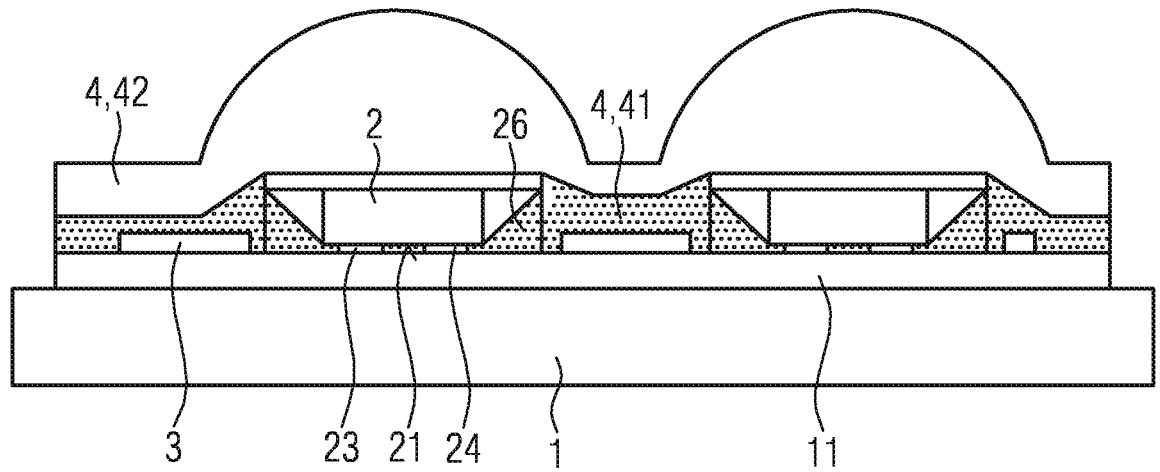

FIG. 6D shows a position in the method in which a potting compound 4, 42 is additionally applied to the components 2 and to the potting compound 4, 41. The potting compound 4, 42 is embodied in particular in a radiation-transmissive fashion and forms lenses above the components 2.

Overall, the components 2 are thus embedded in a potting 4, 42, 41 including two layers. A first layer 41 composed of reflective potting material surrounds the components 2 only in a lateral direction. A second layer 42 composed of radiation-transmissive potting material surrounds the components 2 in a lateral direction and additionally covers the top sides of the components 2.

Figure 7:
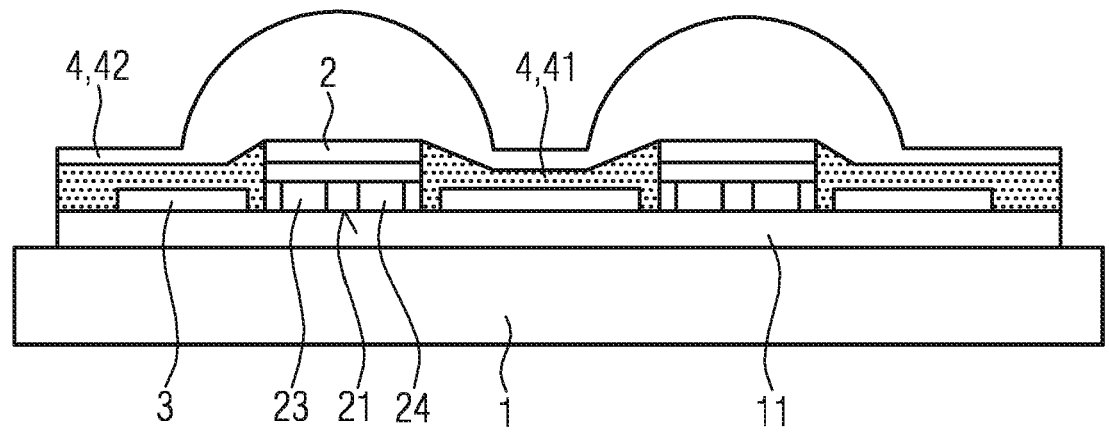

FIG. 7 shows a position in a further exemplary embodiment of the method, which substantially corresponds to the position in FIG. 6D. Unlike in FIG. 6D, however, the components 2 do not include semiconductor chips surrounded by a respective housing 26. Rather, each component 2 consists in each case only of a semiconductor chip, in particular a thin-film semiconductor chip, and of a converter element applied on a radiation exit surface of the semiconductor chip.

This patent application claims the priority of German patent application 10 2017 116 050.7, the disclosure content of which is hereby incorporated by reference.

The invention is not restricted to the exemplary embodiments by the description on the basis thereof. Rather, the invention encompasses any novel feature and also any combination of features, which in particular includes any combination of features in the patent claims, even if these features or this combination itself is not explicitly specified in the patent claims or exemplary embodiments.

LIST OF REFERENCE SIGNS

1 Temporary carrier
2 Optoelectronic component
3 Functional film/functional layer
4 Potting compound/potting
5 Reflector layer
6 Converter layer
10 Top side of the temporary carrier
11 Adhesive layer
20 Top side of the component 2
21 Mounting side of the component 2
22 Side surface of the component 2
23 Contact element of the component 2
24 Contact element of the component 2
26 Housing of the component 2
30 Opening
31 Gap
32 Sidewall
35 Functional coating
40 Lens
41 First layer of the potting/potting compound 4
42 Second layer of the potting/potting compound 4
100 Optoelectronic device
101 Underside of the device 100
103 Side surface of the device 100

The invention claimed is:
1. A method for producing an optoelectronic device, wherein the method comprises:
providing a temporary carrier;
applying a functional film to the temporary carrier, wherein
the functional film has a plurality of openings;
arranging optoelectronic components with a respective mounting side within the openings, wherein
the respective mounting side of each optoelectronic component faces the temporary carrier, the optoelectronic components are thicker than the functional film, such that the optoelectronic components project beyond the functional film in a direction away from the temporary carrier;

arranging a reflector layer in the plurality of openings of the functional film, wherein the reflector layer comprises a different material than the functional film;

applying a potting compound in such a way that the potting compound forms around the optoelectronic components in a lateral direction and covers the functional film in a region laterally next to the optoelectronic components, curing the potting compound to form a potting, wherein the functional film forms a reinforcement for the potting;

severing the functional film in a region between the openings to form individual optoelectronic devices, wherein each optoelectronic device comprises an optoelectronic component surrounded laterally both by the potting and by a functional layer composed of a part of the functional film.

2. The method as claimed in claim 1, wherein the functional film comprises a material having a higher modulus of elasticity than the modulus of elasticity of the cured potting.

3. The method as claimed in claim 1, wherein the functional film is a porous or fibrous film.

4. The method as claimed in claim 1, wherein the material for the functional film comprises a greater thermal conductivity than the cured potting.

5. The method as claimed in claim 1, wherein the functional film comprises a reflective effect when electromagnetic radiation is emitted by the optoelectronic component during operation.

6. The method as claimed in claim 1, wherein the optoelectronic components comprise surface-mountable components having, at the mounting side, electrical contact elements necessary for contacting the optoelectronic component.

7. The method as claimed in claim 1, wherein the potting compound is formed such that each optoelectronic component is encapsulated in a lens comprising the potting,
wherein each lens of each optoelectronic component comprises a greater lateral extent than the associated optoelectronic components.

8. The method as claimed in claim 1, wherein the functional film has sloping sidewalls in the region of the openings, such that the openings become narrower in the direction of the temporary carrier.

9. The method as claimed in claim 1, wherein the optoelectronic component comprises a semiconductor chip.

10. The method as claimed in claim 1, wherein the optoelectronic component comprises a semiconductor chip and a reflective housing laterally surrounding the semiconductor chip.

11. The method as claimed in claim 1,
further comprising introducing a reflector layer in the region of the openings after the arranging of the optoelectronic components within the openings occurs and before the potting compound is applied, and
wherein the reflector layer is thin enough that the functional film projects beyond the reflector layer in a direction away from the temporary carrier.

12. The method as claimed in claim 1, further comprising applying an adhesive layer on a top side of the temporary carrier, such that the functional film and/or the optoelectronic components are/is temporarily secured to the temporary carrier.

13. The method as claimed in claim 1, further comprising detaching the temporary carrier after the potting compound is cured, and wherein the mounting side of the optoelectronic components is at least partly exposed.

14. An optoelectronic device comprising:
an optoelectronic component having a top side, a mounting side opposite the top side, and a side surface connecting the top side and the mounting side,
a functional layer having a main direction of extent and having an opening,
a reflector layer arranged in the opening of the functional layer; wherein the reflector layer comprises a different material than the functional layer;
a potting, wherein:
the optoelectronic component is arranged in an opening of the functional layer in such a way that the functional layer laterally surrounds the optoelectronic component at the level of the mounting side and the main direction of extent of the functional layer runs parallel to the mounting side,
the functional layer is thinner than the optoelectronic component, such that the top side of the optoelectronic component projects beyond the functional layer,
the potting is arranged around the optoelectronic component in a lateral direction,
the potting covers the functional layer in the region laterally next to the opening, and
the functional layer forms a reinforcement for the potting.

15. The optoelectronic device as claimed in claim 14, wherein:
the potting forms a lens, into which the optoelectronic component is embedded,
the lens has a greater lateral extent than the optoelectronic component.

16. The optoelectronic device as claimed in claim 1, wherein:
the optoelectronic device is embodied as a surface-mountable device,
the optoelectronic component has contact elements at its mounting side, said contact elements being exposed as contact element of the device at an underside of the device in the unmounted state of the device.

17. The optoelectronic device as claimed in claim 16, wherein:
at the mounting side a reflector layer is arranged between the contact elements, and
the reflector layer projects beyond the optoelectronic component in a lateral direction and reaches at least as far as the functional layer.

18. The optoelectronic device as claimed in claim 14, wherein
a converter layer for radiation conversion is arranged between the top side of the optoelectronic component and the potting,
the converter layer at least partly covers the side surface of the optoelectronic component,
the converter layer is arranged between the potting and the functional layer in the region laterally next to the optoelectronic component.

19. The method as claimed in claim 1, wherein the reflector layer is further arranged over the functional film.

20. The optoelectronic device as claimed in claim 14, wherein the reflector layer is further arranged over the functional film.

* * * * *